(12) United States Patent
Joo et al.

(10) Patent No.: US 10,903,454 B2
(45) Date of Patent: Jan. 26, 2021

(54) LIGHT-EMITTING DEVICE AND DISPLAY APPARATUS INCLUDING THE LIGHT-EMITTING DEVICE

(71) Applicant: SAMSUNG ELECTRONICS CO., LTD., Suwon-si (KR)

(72) Inventors: Wonjae Joo, Seongnam-si (KR); Jisoo Kyoung, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/752,067

(22) Filed: Jan. 24, 2020

(65) Prior Publication Data
US 2020/0243800 A1 Jul. 30, 2020

(30) Foreign Application Priority Data

Jan. 28, 2019 (KR) .................. 10-2019-0010666

(51) Int. Cl.
| | | |
|---|---|---|
| *H01L 51/52* | (2006.01) | |
| *H01L 27/32* | (2006.01) | |
| *H01L 51/50* | (2006.01) | |

(52) U.S. Cl.
CPC ........ *H01L 51/5265* (2013.01); *H01L 27/322* (2013.01); *H01L 27/3211* (2013.01); *H01L 51/502* (2013.01); *H01L 51/5056* (2013.01); *H01L 51/5072* (2013.01);
(Continued)

(58) Field of Classification Search
None
See application file for complete search history.

(56) References Cited

U.S. PATENT DOCUMENTS

| | | | |
|---|---|---|---|
| 8,614,698 B2 * | 12/2013 | Desieres | ............. H01L 51/5206 345/204 |
| 8,969,853 B2 | 3/2015 | Dussert-Vidalet et al. | |
| 9,231,169 B2 | 1/2016 | Im et al. | |

(Continued)

FOREIGN PATENT DOCUMENTS

| | | |
|---|---|---|
| EP | 3355357 A1 | 8/2018 |
| JP | 2007-115419 A | 5/2007 |

(Continued)

OTHER PUBLICATIONS

Schriber, M.,"Measuring the Magnetism of Light", Phys. Rev. Focus 26, 13 (Sep. 24, 2010). (Year: 2010).*

(Continued)

*Primary Examiner* — J. E. Schoenholtz
(74) *Attorney, Agent, or Firm* — Sughrue Mion, PLLC

(57) ABSTRACT

A light-emitting device includes a metal reflection layer having a phase modulation surface, a color conversion layer provided on the phase modulation surface of the metal reflection layer, a first electrode provided on the color conversion layer, a hole injection and transport layer provided on the first electrode, a blue organic light-emitting layer provided on the hole injection and transport layer, an electron injection and transport layer provided on the blue organic light-emitting layer, and a second electrode provided on the electron injection and transport layer. The phase modulation surface of the metal reflection layer generates magnetic resonance with respect to incident light. The color conversion layer includes a photoluminescent material.

20 Claims, 16 Drawing Sheets

(52) U.S. Cl.
CPC ...... *H01L 51/5092* (2013.01); *H01L 51/5262* (2013.01); *H01L 51/5271* (2013.01)

(56) References Cited

U.S. PATENT DOCUMENTS

| | | | |
|---|---|---|---|
| 9,337,249 B2* | 5/2016 | Wang | H01L 51/5271 |
| 2004/0135502 A1 | 7/2004 | Kobayashi et al. | |
| 2006/0152151 A1 | 7/2006 | Seo | |
| 2007/0085086 A1 | 4/2007 | Gohara et al. | |
| 2009/0212696 A1 | 8/2009 | Terao | |
| 2010/0219427 A1* | 9/2010 | Fukuda | H01L 51/5265 257/89 |
| 2010/0244062 A1 | 9/2010 | Ueno | |
| 2011/0101386 A1 | 5/2011 | Fukuda | |
| 2015/0228697 A1 | 8/2015 | Liu et al. | |
| 2016/0043286 A1 | 2/2016 | Zehetner et al. | |
| 2017/0005235 A1* | 1/2017 | Chou | H01L 51/5281 |
| 2018/0097202 A1 | 4/2018 | Forrest et al. | |
| 2019/0198817 A1* | 6/2019 | Joo | H01L 27/322 |
| 2020/0161592 A1* | 5/2020 | Shin | H01L 51/5072 |
| 2020/0227685 A1* | 7/2020 | Kyoung | H01L 51/5271 |

FOREIGN PATENT DOCUMENTS

| | | |
|---|---|---|
| KR | 10-2014-0078977 A | 6/2014 |
| WO | 2015070217 A1 | 5/2015 |

OTHER PUBLICATIONS

M. Burresi, T. Kampfrath, D. van Oosten, J. C. Prangsma, B.S. Song, S. Noda, and L. Kuipers, "Magnetic Light-Matter Interactions in a Photonic Crystal Nanocavity", Phys. Rev. Lett. 105, 123901, Sep. 17, 2010. (Year: 2010).*

Yeonsang Park et al., "Metasurface electrode light emitting diodes with planar light control", Scientific Reports, 7:14753, Nov. 7, 2017, pp. 1-7 (7 pages total).

Communication dated Jul. 1, 2020, issued by the European Patent Office in European Application No. 20150214.3.

* cited by examiner

LIGHT-EMITTING DEVICE AND DISPLAY APPARATUS INCLUDING THE LIGHT-EMITTING DEVICE

CROSS-REFERENCE TO RELATED APPLICATION

This application claims priority to Korean Patent Application No. 10-2019-0010666, filed on Jan. 28, 2019, in the Korean Intellectual Property Office, the disclosure of which is incorporated herein in its entirety by reference.

BACKGROUND

1. Field

Example embodiments consistent with the present disclosure relates to a light-emitting device and a display apparatus including the light-emitting device.

2. Description of the Related Art

In an organic light-emitting device (OLED), holes supplied from an anode and electrons supplied from a cathode are bonded in an organic light-emitting layer and thus light of a specific color is emitted. A display apparatus using the OLED exhibits superior display properties such as a wide view angle, a fast response time, a thin thickness, low manufacturing costs, and a high contrast. Recently, an organic light-emitting device for emitting light of a desired color by using a microcavity effect, and a display apparatus including the organic light-emitting device, are under development.

SUMMARY

Provided are a light-emitting device and a display apparatus including the light-emitting device.

Additional aspects will be set forth in part in the description which follows and, in part, will be apparent from the description, or may be learned by practice of the presented embodiments.

According to an aspect of an example embodiment, a light-emitting device includes a first metal reflection layer comprising a first phase modulation surface, the first phase modulation surface being configured to generate magnetic resonance with respect to light that is incident upon the first phase modulation surface; a color conversion layer provided on the first phase modulation surface and comprising a photoluminescent material; a first electrode provided on the color conversion layer; a hole injection and transport layer provided on the first electrode; a blue organic light-emitting layer provided on the hole injection and transport layer; an electron injection and transport layer provided on the blue organic light-emitting layer; and a second electrode provided on the electron injection and transport layer.

The first metal reflection layer and the second electrode may form a microcavity having a resonant wavelength.

The first phase modulation surface may include a meta structure in which nano patterns are arranged periodically.

The color conversion layer may include a dielectric in which the photoluminescent material is dispersed.

The photoluminescent material may include at least one from among quantum dots, an organic fluorescent dye, an organic fluorescent semiconductor, and an organic phosphorescent semiconductor.

The photoluminescent material may include a green photoluminescent material configured to convert blue light into green light or a red photoluminescent material configured to convert blue light into red light.

The color conversion layer may contact an entirety of the first phase modulation surface of the first metal reflection layer.

The light-emitting device may further include a transparent planarization layer between the first metal reflection layer and the color conversion layer to cover the first phase modulation surface of the first metal reflection layer.

The first electrode may include a transparent electrode, and the second electrode may include a transflective electrode that transmits a first part of light that is incident upon the second electrode and reflects a second part of the light that is incident upon the second electrode.

The first electrode may include a transparent electrode and the second electrode comprises a reflective electrode, and the first metal reflection layer may be semi-transparent and may be configured to transmit a first part of light that is incident upon the first metal reflection layer and to reflect a second part of the light that is incident upon the first metal reflection layer.

The light-emitting device may further include a second metal reflection layer provided on the second electrode and comprising a second phase modulation surface; and a planarization layer provided between the second electrode and the second metal reflection layer to cover the second phase modulation surface of the second metal reflection layer.

The first metal reflection layer and the second metal reflection layer may form a microcavity having a resonant wavelength.

The first electrode may include a first transparent electrode and the second electrode may include a second transparent electrode, one of the first metal reflection layer and the second metal reflection layer may be reflective with respect to light that is incident upon the one of the first metal reflection layer and the second metal reflection layer, and the other of the first metal reflection layer and the second metal reflection layer may be semi-transparent and configured to transmit a first part of light that is incident upon the other of the first metal reflection layer and the second metal reflection layer and to reflect a second part of the light that is incident upon the other of the first metal reflection layer and the second metal reflection layer.

In accordance with an aspect of the disclosure, a display apparatus includes a plurality of pixels configured to emit light rays of different colors, wherein at least one pixel from among the plurality of pixels includes a first metal reflection layer comprising a first phase modulation surface, the first phase modulation surface being configured to generate magnetic resonance with respect to light that is incident upon the first phase modulation surface; a color conversion layer provided on the first phase modulation surface and comprising a photoluminescent material; a first electrode provided on the color conversion layer; a hole injection and transport layer provided on the first electrode; a blue organic light-emitting layer provided on the hole injection and transport layer; an electron injection and transport layer provided on the blue organic light-emitting layer; and a second electrode provided on the electron injection and transport layer.

The first phase modulation surface may include a meta structure in which nano patterns are arranged periodically.

The color conversion layer may contact an entirety of the first phase modulation surface of the first metal reflection layer.

The at least one pixel may further include a transparent planarization layer between the first metal reflection layer and the color conversion layer to cover the first phase modulation surface of the first metal reflection layer.

The at least one pixel may further include a second metal reflection layer provided on the second electrode and comprising a second phase modulation surface; and a planarization layer provided between the second electrode and the second metal reflection layer to cover the second phase modulation surface of the second metal reflection layer.

The plurality of pixels may include a blue pixel, a green pixel, and a red pixel.

The green pixel may include a green photoluminescent material configured to convert blue light into green light, and the red pixel may include a red photoluminescent material configured to convert blue light into red light.

In accordance with an aspect of the disclosure, an optical microcavity includes a first electrode; and a first metal layer, wherein a surface of the first metal layer facing the first electrode includes a plurality of first nanostructures, and wherein at least one from among a width of each first nanostructure from among the plurality of first nanostructures, a height of each first nanostructure from among the plurality of first nanostructures, and a distance between adjacent first nanostructures from among the plurality of first nanostructures is set based on a resonance wavelength of the optical microcavity.

The optical microcavity may further include a light emitting layer positioned between the first electrode and the first metal layer and configured to emit light of a first wavelength; and a color conversion layer positioned between the light emitting layer and the first metal layer, and the color conversion layer may be configured to receive the light of the first wavelength and emit light of a second wavelength different from the first wavelength.

The color conversion layer may contact the surface of the first metal layer.

The optical microcavity may further include a second electrode positioned between the light emitting layer and the color conversion layer, and the light emitting layer may be configured to emit light based on application of a voltage between the first electrode and the second electrode.

The first electrode may include a semitransparent material, and the first metal layer may include a reflective metal material.

Each first nanostructure from among the plurality of first nanostructures may protrude from the surface of the first metal layer.

Each first nanostructure from among the plurality of first nanostructures may have a cylindrical shape.

Each first nanostructure from among the plurality of first nanostructures may have a rectangular prism shape.

Each first nanostructure from among the plurality of first nanostructures may include a portion of the surface of the first metal layer that is recessed from the surface of the first metal layer.

The light of the first wavelength may be blue light and the light of the second wavelength may be red light.

The light of the first wavelength may be blue light and the light of the second wavelength may be green light.

The first electrode may include a reflective material, and the first metal layer may include a semitransparent metal material.

The optical microcavity may further include a second metal layer positioned such that the first electrode is between the first metal layer and the second metal layer, a surface of the second metal layer facing the first electrode may include a plurality of second nanostructures, and at least one from among a width of each second nanostructure from among the plurality of second nanostructures, a height of each second nanostructure from among the plurality of second nanostructures, and a distance between adjacent second nanostructures from among the plurality of second nanostructures may be set based on the resonance wavelength of the optical microcavity.

The plurality of first nanostructures may be formed in a first region of the surface of the first metal layer to form a first optical microcavity having a first resonance wavelength, a plurality of second nanostructures may be formed in a second region of the surface of the first metal layer to form a second optical microcavity having a second resonance wavelength different from the first resonance wavelength, and at least one from among a width of each second nanostructure from among the plurality of second nanostructures, a height of each second nanostructure from among the plurality of second nanostructures, and a distance between adjacent second nanostructures from among the plurality of second nanostructures may be set based on the second resonance wavelength.

The surface of the first metal layer may include a third region having a flat surface to form a third optical microcavity having a third resonance wavelength, and the first resonance wavelength, the second resonance wavelength, and the third resonance wavelength may correspond to red, green, and blue light, respectively.

BRIEF DESCRIPTION OF THE DRAWINGS

The above and/or other aspects will become apparent and more readily appreciated from the following description of example embodiments, taken in conjunction with the accompanying drawings in which.

DETAILED DESCRIPTION

Figure 1:
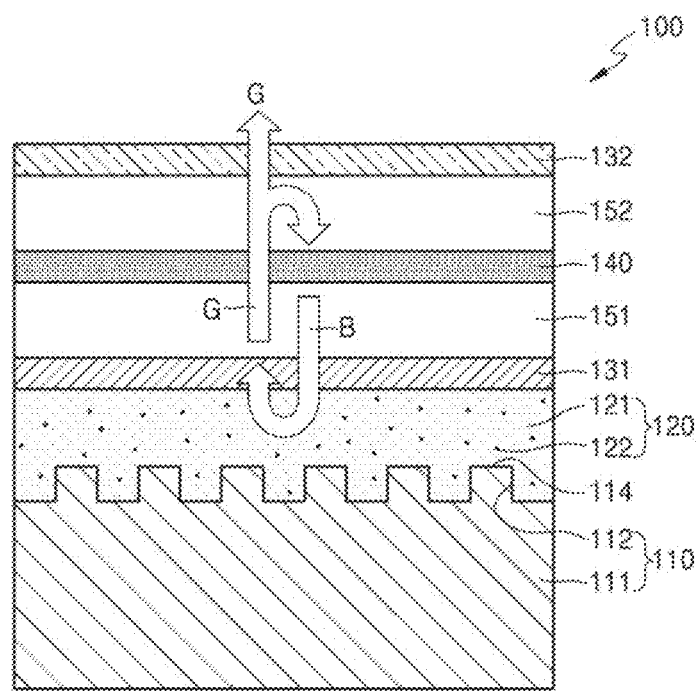
FIG. 1 is a cross-sectional view of a light-emitting device according to an example embodiment.

Reference will now be made in detail to embodiments, examples of which are illustrated in the accompanying drawings, wherein like reference numerals refer to like elements throughout. The thickness or size of each layer illustrated in the drawings may be exaggerated for convenience of explanation and clarity. In this regard, embodiments may have different forms and should not be construed as being limited to the descriptions set forth herein.

Hereinafter, when a constituent element is described as being disposed "above" or "on" another constituent element, the constituent element may be directly on the other constituent element or above the other constituent element in a non-contact manner. The expression of singularity in the specification includes the expression of plurality unless clearly specified otherwise in context. Also, terms such as "comprise", "comprising", "include", and/or "including" may be construed to denote a constituent element, but may not be construed to exclude the existence of or a possibility of addition of another constituent element.

The use of the terms "a" and "an" and "the" and similar referents in the context of describing the disclosure are to be construed to cover both the singular and the plural. Also, the steps of all methods described herein can be performed in any suitable order unless otherwise indicated herein or otherwise clearly contradicted by context. The disclosure is not limited to the described order of the steps. The use of any and all examples, or language provided herein, is intended merely to better illuminate the disclosure and does not pose a limitation on the scope of the disclosure unless otherwise claimed.

Herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Light-emitting devices described in the following embodiments may be organic light-emitting devices (OLED) that emit light of a specific wavelength to the outside.

FIG. 1 is a cross-sectional view of a light-emitting device 100 according to an embodiment.

Referring to FIG. 1, the light-emitting device 100 may include a metal reflection layer 110 having a phase modulation surface 114, a color conversion layer 120 provided on the phase modulation surface 114 of the metal reflection layer 110 and including a photoluminescent material 122, a first electrode 131 provided on the color conversion layer 120, a hole injection and transport layer 151 provided on the first electrode 131, a blue organic light-emitting layer 140 provided on the hole injection and transport layer 151, an electron injection and transport layer 152 provided on the blue organic light-emitting layer 140, and a second electrode 132 provided on the electron injection and transport layer 152.

The first electrode 131 may serve as an anode that supplies holes to the blue organic light-emitting layer 140, and the second electrode 132 may serve as a cathode that supplies electrons to the blue organic light-emitting layer 140. To this end, the first electrode 131 may include a material having a relatively high work function and the second electrode 132 may include a material having a relatively low work function.

The first electrode 131 may be a transparent electrode that transmits light. For example, the first electrode 131 may include a transparent conductive oxide such as an indium tin oxide (ITO), an indium zinc oxide (IZO), and an aluminum zinc oxide (AZO).

The second electrode 132 may be a transflective electrode that reflects part of incident light and transmits another part of the incident light as shown, e.g., in FIG. 1. The second electrode 132 may include metal of a small thickness. For example, the second electrode 132 may be a mixed layer of silver (Ag) and magnesium (Mg) or a mixed layer of aluminum (Al) and lithium (Li), and the thickness of the second electrode 132 may be about 10 nm to about 20 nm. Because the second electrode 132 is thin, part of the incident light may pass through the second electrode 132.

The blue organic light-emitting layer 140 for generating a blue light B is provided between the first electrode 131 and the second electrode 132. The hole injection and transport layer 151 may be provided between the first electrode 131 and the blue organic light-emitting layer 140. The electron injection and transport layer 152 may be provided between the second electrode 132 and the blue organic light-emitting layer 140.

Various additional layers may be further provided as necessary in the light-emitting device 100. For example, an electron blocking layer may be further provided between the hole injection and transport layer 151 and the blue organic light-emitting layer 140. A hole blocking layer may be further provided between the electron injection and transport layer 152 and the blue organic light-emitting layer 140.

In the above structure, the blue light B is generated as holes supplied from the first electrode 131 through the hole injection and transport layer 151 and electrons supplied from the second electrode 132 through the electron injection and transport layer 152 are bonded in the blue organic light-emitting layer 140.

The metal reflection layer 110 may form a microcavity L (i.e., a space in which light resonates) with the second electrode 132. Accordingly, the microcavity L may be formed between the metal reflection layer 110 and the second electrode 132. For example, the light generated from the blue organic light-emitting layer 140 may resonate by reciprocating between the metal reflection layer 110 and the second electrode 132 and then the light corresponding to a resonant wavelength of the microcavity L may be emitted through the second electrode 132.

The resonant wavelength of the microcavity L may be determined by the optical length of the microcavity L. For example, when the resonant wavelength of the microcavity L is λ, the optical length of the microcavity L may be nλ/2, where n is a natural number. The optical length of the microcavity L may be determined by a sum of an optical thickness of layers forming the microcavity L between the metal reflection layer 110 and the second electrode 132, a phase delay by the second electrode 132, and a phase shift, for example, a phase delay, by the metal reflection layer 110. The optical thickness of a layer forming the microcavity L denotes a physical thickness multiplied by the refractive index of the layer, not a simple physical thickness.

According to an embodiment, when the optical thickness of the layers forming the microcavity L and the phase delay by the second electrode 132 are fixed, the optical length of the microcavity L or the resonant wavelength of the microcavity L may be controlled by controlling only the phase shift by the metal reflection layer 110.

To adjust the phase shift by the metal reflection layer 110, a phase modulation surface 114 is formed on a reflective surface of the metal reflection layer 110. The phase modulation surface may have a meta structure in which nano patterns 112 having a nano size are arranged periodically.

Figure 2:
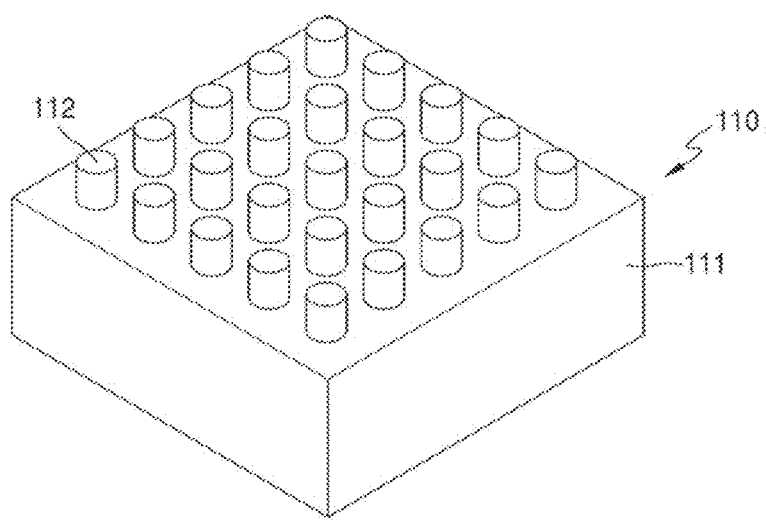
FIG. 2 is a perspective view of a metal reflection layer of FIG. 1.
Figure 3:
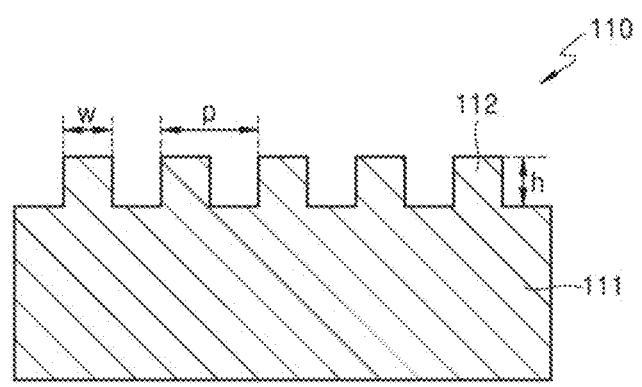
FIG. 3 is a cross-sectional view of a metal reflection layer of FIG. 2.

FIG. 2 is a perspective view of the metal reflection layer 110 of FIG. 1. FIG. 3 is a cross-sectional view of the metal reflection layer 110 of FIG. 2.

Referring to FIGS. 2 and 3, the metal reflection layer 110 may include a base portion 111 and a phase modulation surface 114 formed on an upper surface of the base portion 111. The phase modulation surface 114 may include the nano patterns 112 provided periodically with a predetermined pitch on the upper surface of the base portion 111. As shown in FIG. 2, each of the nano patterns 112 may have a shape of a post protruding from the upper surface of the base portion 111. In detail, each of the nano patterns 112 may have a cylindrical shape. The base portion 111 and the nano patterns 112 may be integrally formed. For example, the base portion 111 and the nano patterns 112 may include at least one metal material of Ag, Al, and Au. However, the disclosure is not limited thereto.

The optical properties of the phase modulation surface 114, for example, the phase delay of the reflected light, may be determined by the size of each of the nano patterns 112. Particularly, a diameter w, a height h, and a pitch p of the nano patterns 112 may affect the phase delay of the reflected light. Accordingly, the resonant wavelength of the microcavity L may be determined by the diameter w and the height h of each of the nano patterns 112 and the pitch p of the nano patterns 112 of the phase modulation surface 114. In other words, assuming that the resonant wavelength of the microcavity L is λ, the diameter w and the height h of each of the nano patterns 112 and the pitch p of the nano patterns 112 of the phase modulation surface 114 may be selected such that the optical length of the microcavity L satisfies nλ/2, where n is a natural number.

The microcavity L of the light-emitting device 100 may have a resonant wavelength of about 430 nm to about 650 nm. In this case, the diameter w of each of the nano patterns 112 of the phase modulation surface 114 may be about 50 nm to about 300 nm, and the height h of each of the nano patterns 112 may be about 0 nm to about 150 nm. Furthermore, the pitch p of the nano patterns 112 may be about 100 nm to about 400 nm. However, the disclosure is not limited thereto. FIG. 1 illustrates an example embodiment in which the microcavity L is adjusted to have a wavelength of a green light G as a resonant wavelength so that the green light G is emitted from the light-emitting device 100.

When the size of the nano patterns 112 of the phase modulation surface 114 is smaller than the resonant wavelength, incident light resonates in a peripheral portion of the nano patterns 112, and thus a plurality of nano-optical resonance structures are formed. In particular, of the incident light, an electric field component does not intrude into a space between the nano patterns 112 and only a magnetic field component resonates in the peripheral portion of the nano patterns 112. Accordingly, the nano-optical resonance structures formed in the space between the nano patterns 112 may become a magnetic resonator that generates magnetic resonance to the incident light.

Although FIGS. 2 and 3 illustrate an example embodiment in which each of the nano patterns 112 has a circular post shape, each of the nano patterns 112 may have, for example, an oval post shape.

Figure 4:
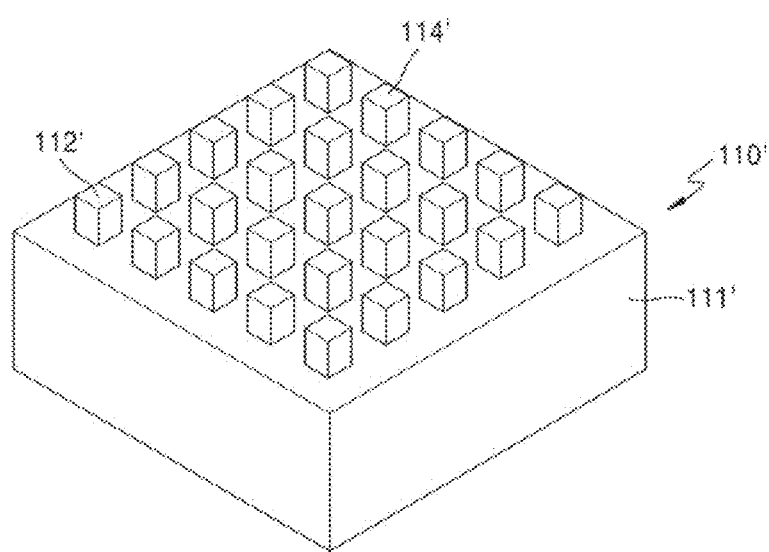
FIG. 4 is a perspective view of a modified example of a metal reflection layer that is applicable to the light-emitting device of FIG. 1.

FIG. 4 is a perspective view of a modified example of a metal reflection layer 100' that is applicable to the light-emitting device 100 of FIG. 1. Referring to FIG. 4, the metal reflection layer 110' may include a base portion 111' and a phase modulation surface 114' formed on an upper surface of the base portion 111'. The phase modulation surface 114' may include nano patterns 112' formed periodically with a predetermined pitch on the upper surface of the base portion 111'. Each of the nano patterns 112' may have a shape of a rectangular post protruding from the upper surface of the base portion 111'.

In FIG. 4, the optical properties of the phase modulation surface 114', for example, the phase delay of the reflected light may be determined by one or more of the width and the height of each of the nano patterns 112' and the pitch of the nano patterns 112'. Although FIG. 4 illustrates an example embodiment in which each of the nano patterns 112' has a rectangular post shape, each of the nano patterns 112' may have various polygonal post (polyprism) shapes such as a triangular post or a pentagonal post.

The above-described nano patterns 112 and 112' may be arranged in various regular array forms. For example, as illustrated in FIGS. 2 to 4, the nano patterns 112 and 112' may be arranged in a rectangular array form or additionally, for example, in a regular triangular shape.

Figure 5:
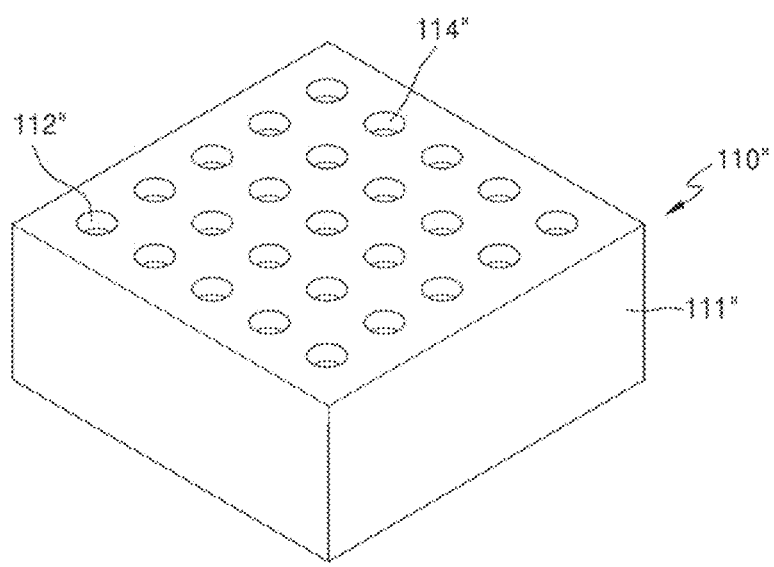
FIG. 5 is a perspective view of a modified example of a metal reflection layer that is applicable to the light-emitting device of FIG. 1.

FIG. 5 is a perspective view of a modified example of a metal reflection layer 110" that is applicable to the light-emitting device 100 of FIG. 1. Referring to FIG. 5, the metal reflection layer 110" may include a base portion 111" and a phase modulation surface 114" formed on the upper surface of the base portion 111". The phase modulation surface may include nano patterns 112" that are provided periodically with a predetermined pitch on the upper surface of the base portion 111". Each of the nano patterns 112" may have a recess having a certain shape formed to a certain depth from the upper surface of the base portion 111". Although FIG. 5 illustrates an example embodiment in which each of the recesses has a cylindrical shape, each of the recesses may have various other shapes. In FIG. 5, the optical properties of the phase modulation surface 114", for example, the phase delay of the reflected light, may be determined by the diameter and the depth of each of the nano patterns 112" and the pitch of the nano patterns 112".

Figure 6:
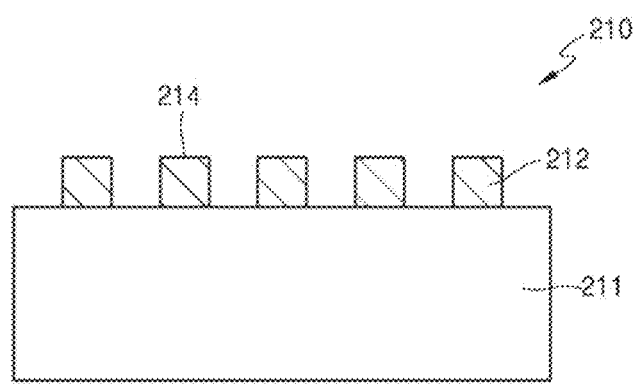
FIG. 6 is a cross-sectional view of a modified example of a metal reflection layer that is applicable to the light-emitting device of FIG. 1.

FIG. 6 is a cross-sectional view of a modified example of a metal reflection layer 210 that is applicable to the light-emitting device 100 of FIG. 1. Referring to FIG. 6, the metal reflection layer 210 may include a base portion 211 and a phase modulation surface 214 formed on an upper surface of the base portion 211. The phase modulation surface 214 may include nano patterns 212 that protrude from an upper surface of the base portion 211. The nano patterns 212, unlike the above description, may be provided separately from the base portion 211. The base portion 211 may include various materials, and the nano patterns 212 may include, for example, at least one metal material of Ag, Al, and Au.

Figure 7:
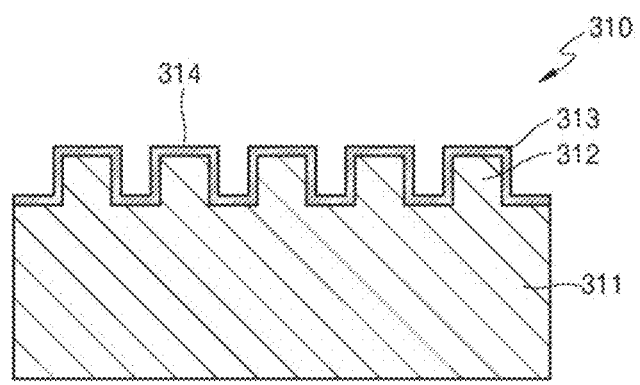
FIG. 7 is a cross-sectional view of a modified example of a metal reflection layer that is applicable to the light-emitting device of FIG. 1.

FIG. 7 is a cross-sectional view of a modified example of a metal reflection layer 310 that is applicable to the light-emitting device of FIG. 1. Referring to FIG. 7, the metal reflection layer 310 may include a base portion 311 and a phase modulation surface 314 formed on an upper surface of the base portion 311. The phase modulation surface 314 may include nano patterns provided on an upper surface of the base portion 311. The nano patterns may include nano structures 312 protruding from an upper surface of the base portion 311 and a metal coating layer 313 coated on surfaces of the nano structures 312. The nano structures 312 may be integrally formed with or provided separately from the base portion 311. The base portion 311 and the nano structures 312 may include various materials, and the metal coating layer 313 may include, for example, at least one metal material of Ag, Al, and Au.

Figure 8A:
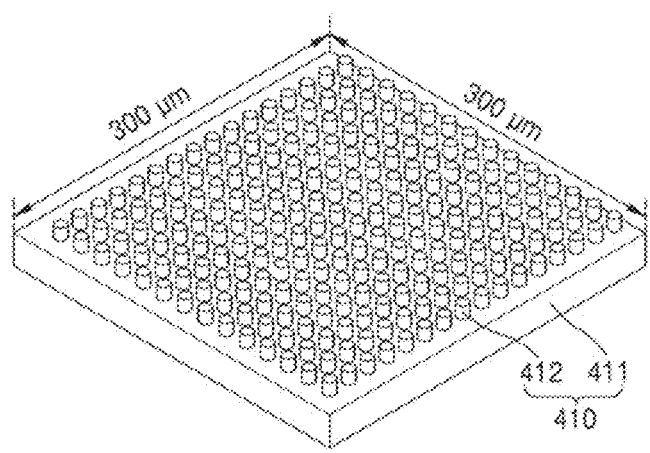
FIG. 8A is a perspective view of an experimental model of a metal reflection layer.

FIG. 8A is a perspective view of an experimental model of a metal reflection layer. Referring to FIG. 8A, an Ag metal reflection layer 410 may include a base portion 411 and nano patterns 412 having a circular post shape and arranged on an upper surface of the base portion 411. The upper surface of the base portion 411 may have an area of 300×300 $\mu m^2$. Each of the nano patterns 412 may have a diameter of about 100 nm and a height of about 100 nm, and the nano patterns 412 may be arranged periodically with a pitch of about 225 nm.

The Ag metal reflection layer 410 illustrated in FIG. 8A may be manufactured by using, for example, a nano transfer printing process as described below. However, this is merely an example method and various other methods may be employed for the manufacture.

The following is an example description of a nano transfer printing process. First, e-beam resist is coated on an upper surface of a silicon wafer having an area of 300×300 $\mu m^2$, and nano hole patterns are formed on the e-beam resist by using an e-beam lithography process. Each of the nano hole patterns has a diameter of about 100 nm, and the nano hole patterns are formed periodically with a pitch of about 225 nm.

Next, the silicon wafer is etched to a depth of about 100 nm by using the nano hole patterns formed on the patterned e-beam resist. The silicon wafer may be etched, for example, for about 10 seconds to about 20 seconds by using a reactive ion etching (RIE) process under an SF6 gas atmosphere. Then, a silicon master having the nano hole patterns is completed by removing the e-beam resist covering the upper surface of the silicon wafer.

Next, after coating UV curable resin on the silicon master, a polyethylene terephthalate (PET) film is covered thereon. An exposure process is performed by using a UV lamp, thereby completing polymerization. When the PET film is detached, reverse patterns of the nano hole patterns formed on the silicon master are transferred to a polymer thin film.

Next, when a UV exposure process is performed after the UV curable resin is coated on the polymer thin film where the reverse patterns are formed, and the PET film is covered thereon, a polymer mold is formed including the nano hole patterns that are the same as those of the silicon master. After an AG thin film is deposited on a polymer mold by placing a polymer mold where the nano hole patterns are formed in a vacuum depositor and by using a thermal deposition method, the Ag thin film is separated from the polymer mold. Then, as illustrated in FIG. 8A, the Ag metal reflection layer 410 including the nano patterns 412 having a circular post shape protruding from the upper surface of the base portion 411 may be completed.

Figure 8B:
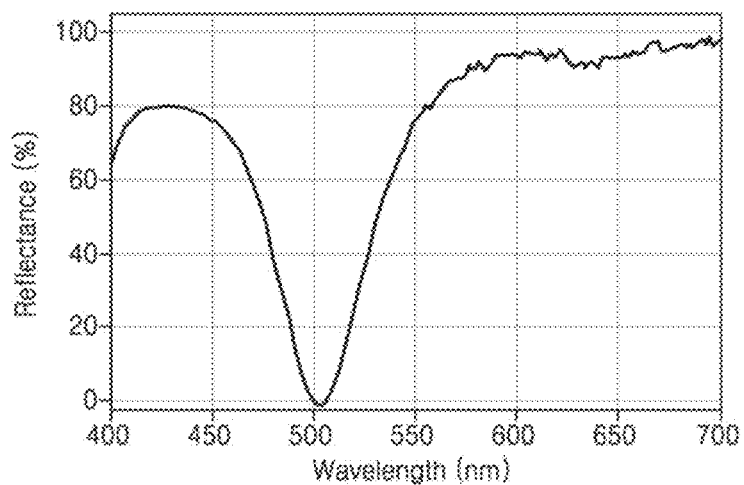
FIG. 8B is a graph showing the reflectance of the metal reflection layer of FIG. 8A.

FIG. 8B is a graph showing the reflectance of the Ag metal reflection layer 410 of FIG. 8A. Referring to FIG. 8B, it may be seen that a resonance effect occurs greatly at about 500 nm that is the wavelength of a green light, and that the properties of a meta mirror having high reflectance occur at about 600 nm that is the wavelength of a red light and at about 450 nm that is the wavelength of a blue light. The intensity of light resonance or a resonant wavelength may be controlled by changing one or more of the shape, size, height, and pitch of nano patterns.

Referring back to FIG. 1, the color conversion layer 120 is provided between the phase modulation surface 114 of the metal reflection layer 110 and the first electrode 131. The color conversion layer 120 may include a dielectric 121 and the photoluminescent material 122 dispersed in the dielectric 121.

The dielectric 121 may serve to planarize an upper portion of the phase modulation surface 114 having a meta structure for a uniform current density of the light-emitting device 100. To this end, the dielectric 121 may cover the phase modulation surface 114 of the metal reflection layer 110 to planarize the upper surface thereof. In other words, the dielectric material 121 may contact an entirety of the phase modulation surface 114. The dielectric 121 may include an insulating material that is transparent to visible rays. The dielectric 121 may include, for example, $SiO_2$, $SiN_x$, $Al_2O_3$, or $HfO_2$, but the disclosure is not limited thereto. Furthermore, the dielectric 121 may include an acryl based or urethane based polymer material.

The photoluminescent material 122 may serve to convert the incident light, that is, the blue light B generated from the blue organic light-emitting layer 140, into light of a certain wavelength. In detail, the photoluminescent material 122 may convert light having relatively high energy into light having relatively low energy. For example, the photoluminescent material 122 may convert the blue light B into the green light G or the blue light B to the red light R. FIG. 1 illustrates a case in which a green photoluminescent material that converts the blue light B in to the green light G is used as the photoluminescent material 122.

The photoluminescent material 122 may include at least one of, for example, quantum dots, an organic fluorescent dye, an organic fluorescent semiconductor, and an organic phosphorescent semiconductor. The quantum dot may include, for example, a II-VI group semiconductor material or a III-V group semiconductor material.

The color conversion layer 120 may be formed by using an organic binder including the photoluminescent material 122. In this case, the organic binder including the photoluminescent material 122 may be manufactured, for example, by dissolving a polymer material and the photoluminescent material 122 in an organic solvent or blending heat crosslinkable resin or UV crosslinkable resin with the photoluminescent material 122. However, the disclosure is not limited thereto.

According to the related art, a method of attaching a color conversion film including a photoluminescent material that converts a blue light into a green light to a light-emitting surface of an organic light-emitting device has been used to emit the green light by using an organic light-emitting device that emits the blue light. However, in this case, when the blue light is completely converted into the green light, luminous efficiency may decrease and color purity may deteriorate. To address these matters, a method of additionally providing a color filter on the color conversion film has been used.

In the light-emitting device 100 according to an embodiment, as illustrated in FIG. 1, the microcavity L has the wavelength of the green light G as a resonant wavelength, and when a green photoluminescent material is used as the photoluminescent material 122, the blue light B generated from the blue organic light-emitting layer 140 is converted by the photoluminescent material 122 into the green light G and then resonates by reciprocating between the metal reflection layer 110 and the second electrode 132 to be emitted to the outside through the second electrode 132. Accordingly, luminous efficiency of the green light G may be improved.

When the blue light B generated from the blue organic light-emitting layer 140 is converted into a surface plasmon in the meta structure of the phase modulation surface 114, an efficiency of converting the surface plasmon into the green light G may be highly increased by the photoluminescent material 122, that is, a green photoluminescent material, provided in the color conversion layer 120. Light conversion efficiency may be improved because the light intensity of a surface plasmon increases to very high levels due to the concentration of optical energy on a small volume of a metal surface having a meta structure. When the intensity of an electric field around the meta structure increases and the photoluminescent material 122 is located in the strong electric field, the light conversion efficiency may be further improved due to the Purcell effect.

As such, in the light-emitting device 100 according to an embodiment, luminous efficiency is greatly improved due to the color conversion layer 120 including the photoluminescent material 122 being provided on the phase modulation surface 114 having a meta structure.

Figure 9A:
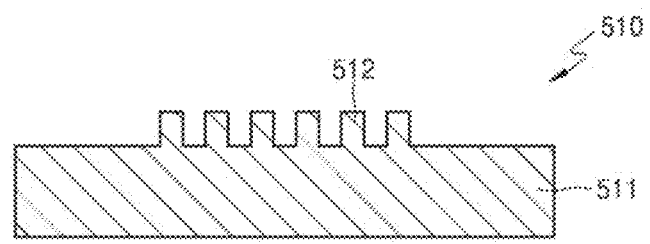
FIG. 9A is a cross-sectional view of an experimental model of a metal reflection layer.

FIG. 9A is a cross-sectional view of an experimental model of a metal reflection layer. FIG. 9A illustrates an Ag metal reflection layer 510 in which the nano patterns 512 are provided on an upper surface of the base portion 511. The Ag metal reflection layer 510 may include a central portion where the nano patterns 512 having a circular post shape are arranged and a flat peripheral portion around the nano patterns 512. The central portion where the nano patterns 512 are provided may have an area of about 300×300 $\mu m^2$. Each of the nano patterns 512 has a diameter of about 100 nm and a height of about 100 nm, and the nano patterns 512 are arranged periodically with a pitch of about 225 nm.

Figure 9B:
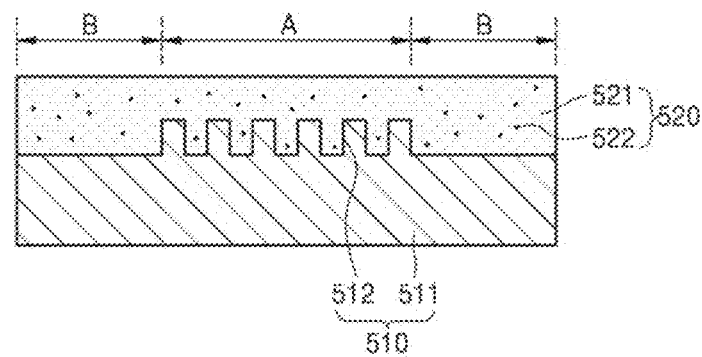
FIG. 9B is a cross-sectional view illustrating a color conversion layer covering an upper surface of the metal reflection layer of FIG. 9A according to an example embodiment.

FIG. 9B is a cross-sectional view showing a color conversion layer 520 covering an upper surface of the Ag metal reflection layer 510 of FIG. 9A. The color conversion layer 520 of FIG. 9B may be formed by spin coating a solution obtained by dissolving polymethyl methacrylate (PMMA) 521 that is a dielectric and rhodamine 6G 522 that is an organic fluorescent dye in chlorobenzene that is an organic solvent, on an upper surface of the Ag metal reflection layer 510.

As a result of measuring the luminescence properties of the structure of FIG. 9B with a Dark Field image, strong luminescence is observed in a meta structure region A where the nano patterns 512 are formed, whereas very weak luminescence is observed in a flat region B where the nano patterns 512 are not formed. Accordingly, it may be seen that providing the photoluminescent material on a metal surface including the meta structure rather than on a flat metal surface may much improve luminescence properties.

Figure 10:
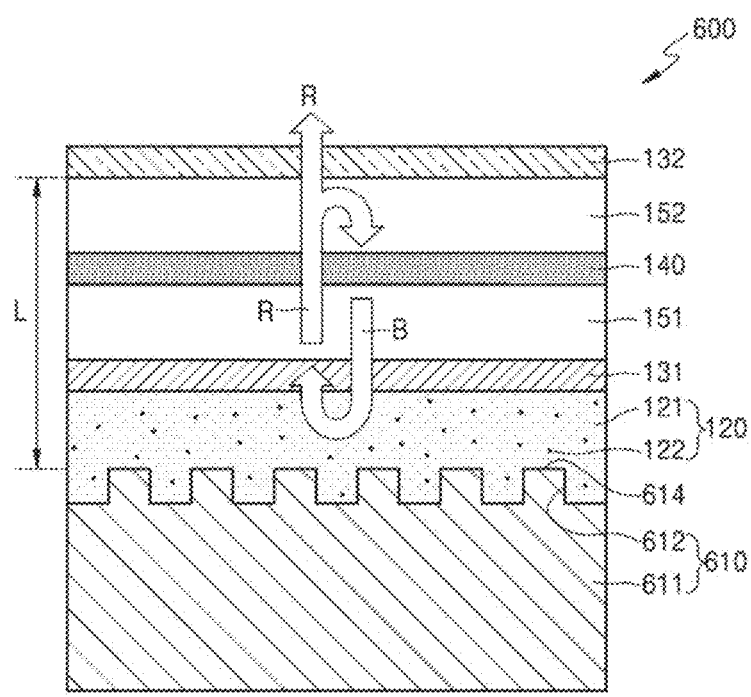
FIG. 10 is a cross-sectional view of a light-emitting device according to an example embodiment.

FIG. 10 is a cross-sectional view of a light-emitting device 600 according to another embodiment. The light-emitting device 600 of FIG. 10 is identical to the light-emitting device 100 of FIG. 1, except for the emission of the red light R instead of the green light G. In the following description, differences from the light-emitting device 100 of FIG. 1 are described.

Referring to FIG. 10, a metal reflection layer 610 may form the microcavity L with the second electrode 132, and a phase modulation surface 614 to adjust a phase shift may be formed on a reflective surface of the metal reflection layer 610. The phase modulation surface 614 may have a meta structure in which the nano patterns 612 are arranged periodically on an upper surface of a base portion 611. In an embodiment, the microcavity L may be adjusted such that the resonant wavelength is the wavelength of the red light R. The metal reflection layer 610 of FIG. 10 may include any one of the metal reflection layers illustrated in FIGS. 2 to 7.

The color conversion layer 120 is provided on a phase modulation surface 614 of the metal reflection layer 610. The color conversion layer 120 may include the dielectric 121 and the photoluminescent material 122 dispersed in the dielectric 121. In an embodiment, a red photoluminescent material that converts the blue light B generated from the blue organic light-emitting layer 140 into the red light R may be used as the photoluminescent material 122.

In the light-emitting device 600 of FIG. 10, the blue light B generated from the blue organic light-emitting layer 140 is converted by the photoluminescent material 122 into the red light R and then resonates by reciprocating between the metal reflection layer 610 and the second electrode 132 to be emitted to the outside through the second electrode 132.

As described above, in the light-emitting device 600 of FIG. 10, as the photoluminescent material 122 is provided on the phase modulation surface 614 of the metal reflection layer 610 and thus the blue light B that is incident light may be converted into light of a desired wavelength to be emitted to the outside, the luminous efficiency may be improved. Furthermore, as the phase modulation surface 614 of the metal reflection layer 610 is formed in the meta structure, and the photoluminescent material 122 is disposed on the meta structure, the luminous efficiency may be further improved.

Figure 11:
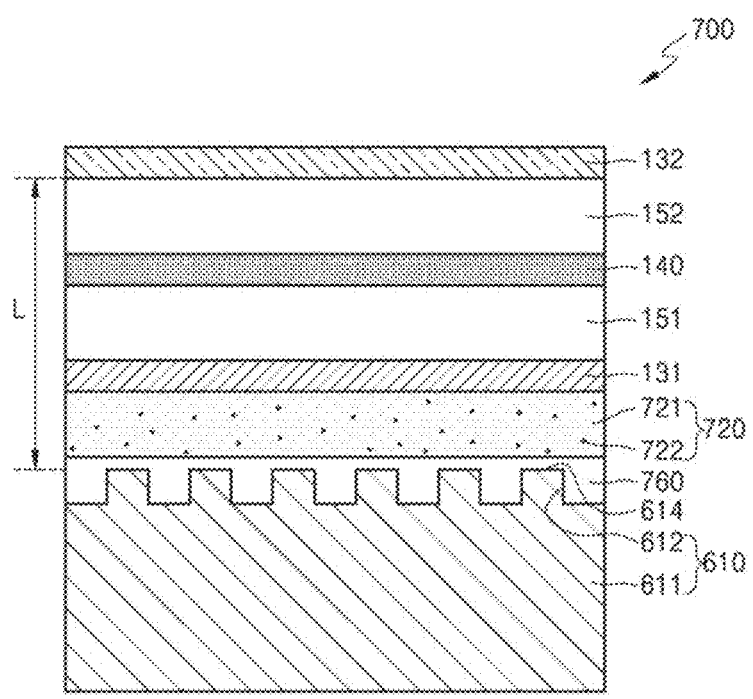
FIG. 11 is a cross-sectional view of a light-emitting device according to an example embodiment.

FIG. 11 is a cross-sectional view of a light-emitting device 700 according to an embodiment. The light-emitting device 700 of FIG. 11 is the same as the light-emitting device 100 of FIG. 1, except that a transparent planarization layer 760 is provided between the metal reflection layer 610 and a color conversion layer 720. In the following description, differences from the light-emitting device 100 of FIG. 1 are described.

Referring to FIG. 11, the transparent planarization layer 760 is provided on the phase modulation surface 614 of the metal reflection layer 610, and the color conversion layer 720 is provided on the planarization layer 760. The phase modulation surface 614 of the metal reflection layer 610 may have a metal structure in which the nano patterns 612 are arranged periodically on an upper surface of the base portion 611.

The planarization layer 760 may planarize, for uniform current density, an upper portion of the phase modulation surface 614 having a meta structure. To this end, the planarization layer 760 may planarize the upper surface of the phase modulation surface 614 of the metal reflection layer 610 by covering the phase modulation surface 614 (i.e., contacting an entirety of the phase modulation surface 614). The planarization layer 760 may include an insulating material that is transparent to visible rays. The planarization layer 760 may include, for example, $SiO_2$, $SiN_x$, $Al_2O_3$, or $HfO_2$, but the disclosure is not limited thereto.

The color conversion layer 720 is provided on the upper surface of the planarization layer 760. The color conversion layer 720 may include a dielectric 721 and a photoluminescent material 722 dispersed in the dielectric 721. The dielectric 721 may include an insulating material that is transparent to visible rays. The dielectric 721 may include the same material as the planarization layer 760, but the disclosure is not limited thereto.

The photoluminescent material 722 may convert incident light, that is, the blue light B, into light of a certain wavelength. In detail, the photoluminescent material 722 may convert light having relatively high energy into light having relatively low energy. The photoluminescent material 722 may include, for example, a green photoluminescent material or a red photoluminescent material. The photoluminescent material 722 may include at least one of, for example, quantum dots, an organic fluorescent dye, an organic fluorescent semiconductor, and an organic phosphorescent semiconductor. The color conversion layer 720 may be formed by using an organic binder including the photoluminescent material 722.

Figure 12:
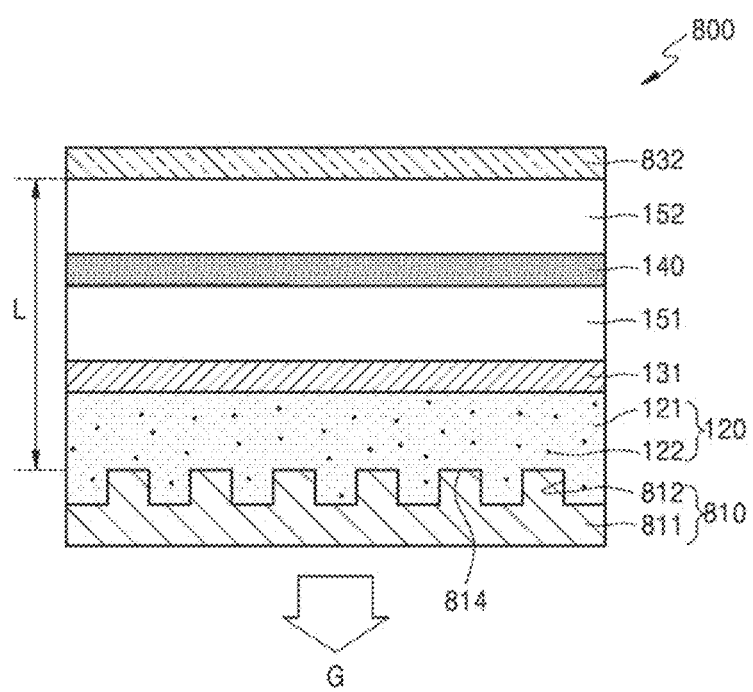
FIG. 12 is a cross-sectional view of a light-emitting device according to an example embodiment.

FIG. 12 is a cross-sectional view of a light-emitting device 800 according to an embodiment. The light-emitting device 800 of FIG. 12 is the same as the light-emitting device 100 of FIG. 1, except that a metal reflection layer 810 is semi-transparent and a second electrode 832 is a reflective electrode. In other words, light is emitted from the light-emitting device 800 in an opposite direction to the direction of the light emitted by the light-emitting device 100. In the following description, differences from the light-emitting device 100 of FIG. 1 are described.

Referring to FIG. 12, the first electrode 131 provided under the blue organic light-emitting layer 140 may be a transparent electrode, and the second electrode 832 provided above the blue organic light-emitting layer 140 may be a reflective electrode that reflects incident light. The metal reflection layer 810 provided under the first electrode 131 may be semi-transparent and may transmit a part of light and reflect another part of the light.

The metal reflection layer 810 may form the microcavity L with the second electrode 832. A phase modulation surface 814 to adjust a phase shift is formed on a reflective surface of the metal reflection layer 810. The phase modulation surface 814 of the metal reflection layer 810 may have a meta surface in which nano patterns 812 are arranged periodically on an upper surface of the base portion 811. FIG. 12 illustrates an example embodiment in which the microcavity L is adjusted to have the wavelength of the green light G as a resonant wavelength.

The color conversion layer 120 is provided between the phase modulation surface 814 of the metal reflection layer 810 and the first electrode 131. The color conversion layer 120 may include the dielectric 121 and a photoluminescent material dispersed in the dielectric 121. FIG. 12 illustrates an example embodiment in which a green photoluminescent material that converts the blue light B into the green light G is used as the photoluminescent material 122.

In the light-emitting device 800 of FIG. 12, the blue light B generated from the blue organic light-emitting layer 140 is converted by the photoluminescent material 122 into the green light G, and then resonates by reciprocating between the metal reflection layer 810 and the second electrode 832 to be emitted to the outside through the metal reflection layer 810.

Figure 13:
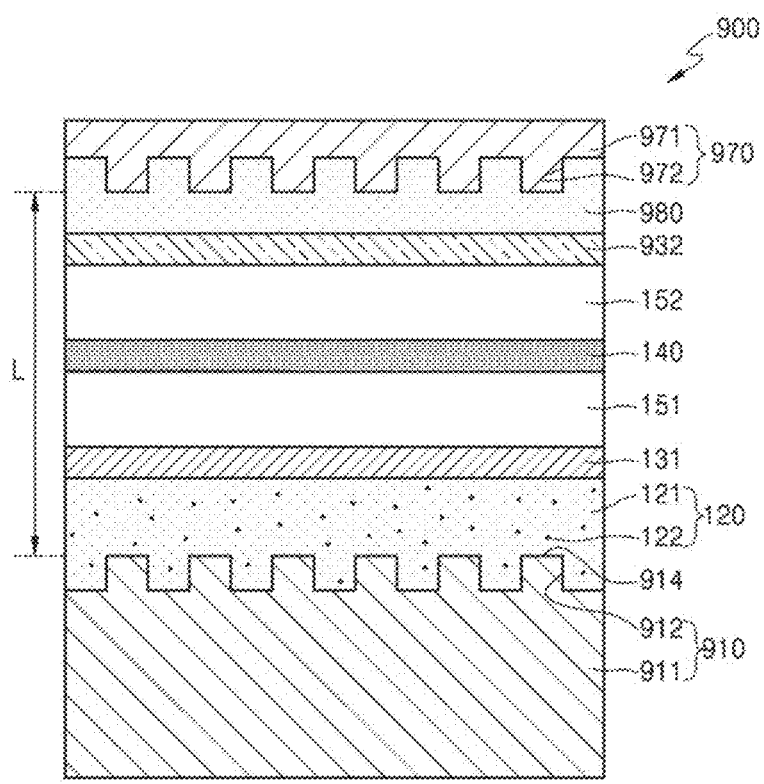
FIG. 13 is a cross-sectional view of a light-emitting device according to an example embodiment.

FIG. 13 is a cross-sectional view of a light-emitting device 900 according to an embodiment. In the following description, differences from the light-emitting device 100 of FIG. 1 are described.

Referring to FIG. 13, the light-emitting device 900 may include a first metal reflection layer 910 including a first phase modulation surface 914, the color conversion layer 120, the first electrode 131, the hole injection and transport layer 151, the blue organic light-emitting layer 140, the electron injection and transport layer 152, a second electrode 932, a planarization layer 980, and a second metal reflection layer 970 including a second phase modulation surface 974. The first and second metal reflection layers 910 and 970 may form the microcavity L.

A first phase modulation surface 914 of the first metal reflection layer 910 may have a meta structure in which first nano patterns 912 are arranged periodically on an upper surface of a first base portion 911. The second phase modulation surface 974 of the second metal reflection layer 970 may have a meta structure in which second nano patterns 972 are arranged periodically on a lower surface of a second base portion 971. The shapes, sizes, and pitches of the first and second nano patterns 912 and 972 may be adjusted such that the microcavity L formed by the first and second metal reflection layers 910 and 970 has a certain resonant wavelength.

One of the first and second metal reflection layers 910 and 970 may have reflectivity, and the other may be semi-transparent and transmit a part of light and reflect another part of the light. FIG. 13 illustrates an embodiment in which the first metal reflection layer 910 has reflectivity and the second metal reflection layer 970 is semi-transparent. The first and second electrodes 131 and 932 may be transparent electrodes.

The color conversion layer 120 is provided between the first metal reflection layer 910 and the first electrode 131. The color conversion layer 120 may include the dielectric 121 and a photoluminescent material dispersed in the dielectric 121. The planarization layer 980 that is transparent is provided between the second metal reflection layer 970 and the second electrode 932. The planarization layer 980 may planarize a lower portion of the second phase modulation surface 974 having the meta structure for uniform current density of the light-emitting device 900. To this end, the planarization layer 980 may planarize a lower surface of the second phase modulation surface 974 of the second metal reflection layer 970 by covering the same (i.e., the planarization layer 980 may contact an entirety of the phase modulation surface 974). The planarization layer 980 may include an insulating material that is transparent to visible rays. Although not illustrated in the drawings, the photoluminescent material 122 included in the color conversion layer 120 may be further provided in the planarization layer 980.

In the light-emitting device 900 of FIG. 13, the blue light B generated in the blue organic light-emitting layer 140 is converted by the photoluminescent material 122 in the color conversion layer 120 into light of a certain wavelength, and then resonates by reciprocating between the first metal reflection layer 910 and the second metal reflection layer 970 to be emitted to the outside through the second metal reflection layer 970 that is semi-transparent.

According to the above example embodiments, by providing a photoluminescent material on a phase modulation surface of a metal reflection layer, the blue light B that is incident light may be converted into light of a desired wavelength, for example, the green light G or the red light R, and emitted to the outside. Accordingly, luminous efficiency may be improved. Furthermore, a phase modulation surface of a metal reflection layer is formed in a meta structure, and the photoluminescent material is located on the meta structure, thereby further improving luminous efficiency.

Figure 14:
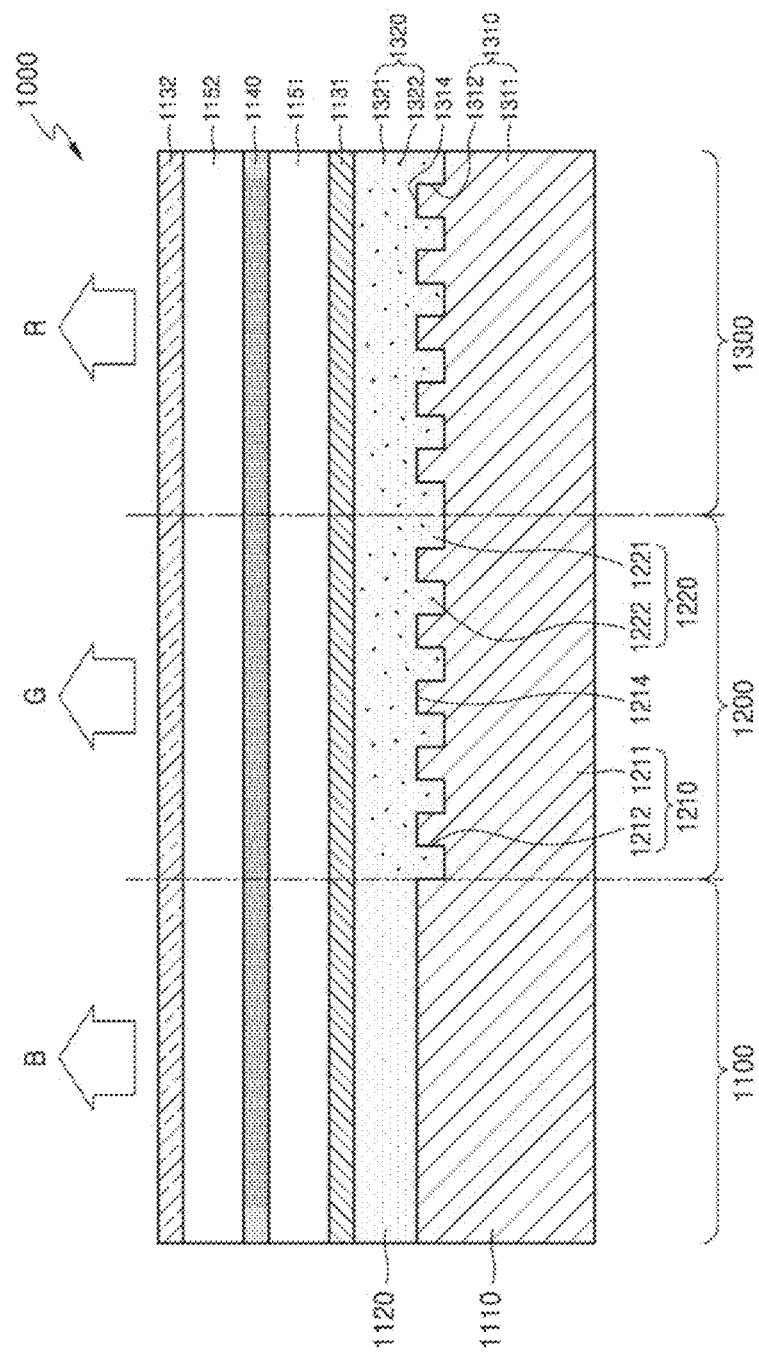
FIG. 14 is a cross-sectional view of a display apparatus according to an example embodiment.

FIG. 14 is a cross-sectional view of a display apparatus 1000 according to an embodiment.

Referring to FIG. 14, the display apparatus 1000 may include a plurality of pixels emitting lights (i.e., light rays) of different colors. The pixels may include red, green, and blue pixels 1300, 1200, and 1100 that are arranged adjacent to one another on the same plane as a substrate. FIG. 14 illustrates, for convenience of explanation, only one unit pixel including the red, green, and blue pixels 1300, 1200, and 1100. In the display apparatus 1000 of FIG. 14, each of the red pixel 1300 and the green pixel 1200 may have a structure similar to the light-emitting device 100 of FIG. 1.

The red pixel 1300 may include a first metal reflection layer 1310 including a first phase modulation surface 1314, a first color conversion layer 1320 provided on the first phase modulation surface 1314 and including a first photoluminescent material 1322, a first electrode 1131 provided on the first color conversion layer 1320, a hole injection and transport layer 1151 provided on the first electrode 1131, a blue organic light-emitting layer 1140 provided on the hole injection and transport layer 1151, an electron injection and transport layer 1152 provided on the blue organic light-emitting layer 1140, and a second electrode 1132 provided on the electron injection and transport layer 1152.

The first electrode 1131 may be a transparent electrode that transmits light, and the second electrode 1132 may be a transflective electrode that reflects a part of light and transmits another part of the light. The blue organic light-emitting layer 1140 may be provided between the first electrode 1131 and the second electrode 1132. The hole injection and transport layer 1151 may be provided between the first electrode 1131 and the blue organic light-emitting layer 1140. The electron injection and transport layer 1152 may be provided between the second electrode 1132 and the blue organic light-emitting layer 1140.

The first metal reflection layer 1310 may form a first microcavity with the second electrode 1132. The first metal reflection layer 1310 may include, for example, at least one metal material of Ag, Al, and Au, but the disclosure is not limited thereto.

The first microcavity may have a resonant wavelength of the red light R by adjusting a phase shift by the first metal reflection layer 1310. To this end, the first phase modulation surface 1314 is formed on a reflective surface of the first metal reflection layer 1310. The first metal reflection layer 1310 may, for example, have the structure illustrated in FIGS. 2 and 3. In detail, the first phase modulation surface 1314 may have a meta structure in which nano patterns 1312 having a circular post shape protruding from an upper surface of the base portion 1311 are arranged periodically. However, this is merely an example, and the first metal reflection layer 1310 may have structures illustrated in FIGS. 4 to 7.

The first color conversion layer 1320 covers a first phase modulation surface 1314 of the first metal reflection layer 1310. The first color conversion layer 1320 may include a dielectric 1321 and the first photoluminescent material 1322 dispersed in the dielectric 1321. The dielectric 1321 may include an insulating material that is transparent to visible rays. The first photoluminescent material 1322 may include a red photoluminescent material that converts the blue light B into the red light R. The first photoluminescent material 1322 may include at least one of, for example, quantum dots, an organic fluorescent dye, an organic fluorescent semiconductor, and an organic phosphorescent semiconductor.

The green pixel 1200 may include a second metal reflection layer 1210 including a second phase modulation surface 1214, a second color conversion layer 1220 provided on the second phase modulation surface 1214 and including a second photoluminescent material 1222, the first electrode 1131 provided on the second color conversion layer 1220, the hole injection and transport layer 1151 provided on the first electrode 1131, the blue organic light-emitting layer 1140 provided on the hole injection and transport layer 1151, the electron injection and transport layer 1152 provided on the blue organic light-emitting layer 1140, and the second electrode 1132 provided on the electron injection and transport layer 1152. As the first and second electrodes 1131 and 1132 and the blue organic light-emitting layer 1140 are described above, descriptions thereof are omitted.

The second metal reflection layer 1210 may form a second microcavity with the second electrode 1132. The second metal reflection layer 1210, like the first metal reflection layer 1310, may include, for example, at least one metal material of Ag, Al, and Au, but the disclosure is not limited thereto.

The second microcavity may have a resonant wavelength of the green light G by adjusting the phase shift by the second metal reflection layer 1210. To this end, the second phase modulation surface 1214 may be formed on a reflective surface of the second metal reflection layer 1210. The second metal reflection layer 1210 may, for example, have the structure illustrated in FIGS. 2 and 3. In detail, the second phase modulation surface 1214 may have a metal structure in which nano patterns 1212 having a circular post shape protruding from an upper surface of the base portion 1211 are arranged periodically. However, this is merely an example, and the second metal reflection layer 1210 may have the structures illustrated in FIGS. 4 to 7.

The second color conversion layer 1220 covers the second phase modulation surface 1214 of the second metal reflection layer 1210. The second color conversion layer 1220 may include a dielectric 1221 and the second photoluminescent material 1222 dispersed in the dielectric 1221. The second photoluminescent material 1222 may include a green photoluminescent material that converts the blue light B into the green light G. The second photoluminescent material 1222, like the first photoluminescent material 1322, may include at least one of, for example, quantum dots, an organic fluorescent dye, an organic fluorescent semiconductor, and an organic phosphorescent semiconductor.

A blue pixel 1100 may include a third metal reflection layer 1110, a dielectric layer 1120 provided on the third metal reflection layer 1110, the first electrode 1131 provided on the dielectric layer 1120, the hole injection and transport layer 1151 provided on the first electrode 1131, the blue organic light-emitting layer 1140 provided on the hole injection and transport layer 1151, the electron injection and transport layer 1152 provided on the blue organic light-emitting layer 1140, and the second electrode 1132 provided on the electron injection and transport layer 1152. As the first and second electrodes 1131 and 1132 and the blue organic light-emitting layer 1140 are described above, descriptions thereof are omitted.

The third metal reflection layer 1110 may form a third microcavity with the second electrode 1132. The third metal reflection layer 1110, like the first and second metal reflection layers 1310 and 1210, may include, for example, at least one metal material of Ag, Al, and Au, but the disclosure is not limited thereto. The third microcavity may have a resonant wavelength of the blue light B by adjusting the structural and optical properties of the layers forming the third microcavity.

The dielectric layer 1120 covers an upper surface of the third metal reflection layer 1110. The dielectric layer 1120 may include an insulating material that is transparent to visible rays. The dielectric layer 1120 may include the same material as the dielectrics 1321 and 1221 forming the above-described first and second color conversion layers 1320 and 1220. However, the disclosure is not limited thereto.

In the display apparatus 1000 configured as above, in the red pixel 1300, the blue light B generated from the blue organic light-emitting layer 1140 may be converted by the first photoluminescent material 1322 into the red light R, and then may resonate by reciprocating between the first metal reflection layer 1310 and the second electrode 1132 to be emitted to the outside through the second electrode 1132.

In the green pixel 1200, the blue light B generated from the blue organic light-emitting layer 1140 may be converted by the second photoluminescent material 1222 into the green light G, and then may resonate by reciprocating between the second metal reflection layer 1210 and the second electrode 1132 to be emitted to the outside through the second electrode 1132. In the blue pixel 1100, the blue light B generated from the blue organic light-emitting layer 1140 may resonate by reciprocating between the third metal reflection layer 1110 and the second electrode 1132, and then may be emitted to the outside through the second electrode 1132.

In the display apparatus 1000 of FIG. 14, the red pixel 1300 and the green pixel 1200 are described to have the same structure as those of the light-emitting device 100 of FIG. 1. However, the disclosure is not limited thereto, and the red and green pixels 1300 and 1200 may, for example, have the same structure as those of the light-emitting devices 700, 800, and 900 of FIGS. 11 to 13. Furthermore, in the display apparatus 1000 of FIG. 14, the red and green pixels 1300 and 1200 each have the phase modulation surface 1314 and 1214, respectively, and the blue pixel 1100 does not have the phase modulation surface. However, the disclosure is not limited thereto, and any two of the red, green, and blue pixels 1300, 1200, and 1100 may have the phase modulation surface, and the other pixel thereof does not have the phase modulation surface. Furthermore, all of the red, green, and blue pixels 1300, 1200, and 1100 may have the phase modulation surface.

In the above-described embodiments, as the photoluminescent material is provided on the phase modulation surface of the metal reflection layer, the blue light B that is incident light may be converted into light of a desired wavelength, for example, the green light G or the red light R, to be emitted to the outside, and thus the luminous efficiency may be improved. Furthermore, as the phase modulation surface of the metal reflection layer may have a meta structure, and the photoluminescent material is located on the meta structure, the luminous efficiency may be further improved.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A light-emitting device comprising:
a first metal reflection layer comprising a first phase modulation surface, the first phase modulation surface being configured to generate magnetic resonance with respect to light that is incident upon the first phase modulation surface;
a color conversion layer provided on the first phase modulation surface and comprising a photoluminescent material;
a first electrode provided on the color conversion layer;
a hole injection and transport layer provided on the first electrode;
a blue organic light-emitting layer provided on the hole injection and transport layer;
an electron injection and transport layer provided on the blue organic light-emitting layer; and
a second electrode provided on the electron injection and transport layer.

2. The light-emitting device of claim 1, wherein the first metal reflection layer and the second electrode form a microcavity having a resonant wavelength.

3. The light-emitting device of claim 1, wherein the first phase modulation surface has a meta structure in which nano patterns are arranged periodically.

4. The light-emitting device of claim 1, wherein the color conversion layer comprises a dielectric in which the photoluminescent material is dispersed.

5. The light-emitting device of claim 4, wherein the photoluminescent material comprises at least one of quantum dots, an organic fluorescent dye, an organic fluorescent semiconductor, and an organic phosphorescent semiconductor.

6. The light-emitting device of claim 1, wherein the photoluminescent material comprises a green photoluminescent material configured to convert blue light into green light or a red photoluminescent material configured to convert blue light into red light.

7. The light-emitting device of claim 1, wherein the color conversion layer contacts an entirety of the first phase modulation surface of the first metal reflection layer.

8. The light-emitting device of claim 1, further comprising:
a transparent planarization layer between the first metal reflection layer and the color conversion layer to cover the first phase modulation surface of the first metal reflection layer.

9. The light-emitting device of claim 1, wherein the first electrode comprises a transparent electrode, and
wherein the second electrode comprises a transflective electrode that transmits a first part of light that is incident upon the second electrode and reflects a second part of the light that is incident upon the second electrode.

10. The light-emitting device of claim 1, wherein the first electrode comprises a transparent electrode and the second electrode comprises a reflective electrode, and
wherein the first metal reflection layer is semi-transparent and is configured to transmit a first part of light that is incident upon the first metal reflection layer and to reflect a second part of the light that is incident upon the first metal reflection layer.

11. The light-emitting device of claim 1, further comprising:
a second metal reflection layer provided on the second electrode and comprising a second phase modulation surface; and
a planarization layer provided between the second electrode and the second metal reflection layer to cover the second phase modulation surface of the second metal reflection layer.

12. The light-emitting device of claim 11, wherein the first metal reflection layer and the second metal reflection layer form a microcavity having a resonant wavelength.

13. The light-emitting device of claim 11, wherein the first electrode comprises a first transparent electrode and the second electrode comprises a second transparent electrode,
wherein one of the first metal reflection layer and the second metal reflection layer is reflective with respect to light that is incident upon the one of the first metal reflection layer and the second metal reflection layer, and
wherein the other of the first metal reflection layer and the second metal reflection layer is semi-transparent and configured to transmit a first part of light that is incident upon the other of the first metal reflection layer and the second metal reflection layer and to reflect a second part of the light that is incident upon the other of the first metal reflection layer and the second metal reflection layer.

14. A display apparatus comprising:
a plurality of pixels configured to emit light rays of different colors,
wherein at least one pixel from among the plurality of pixels comprises:
a first metal reflection layer comprising a first phase modulation surface, the first phase modulation surface being configured to generate magnetic resonance with respect to light that is incident upon the first phase modulation surface;
a color conversion layer provided on the first phase modulation surface and comprising a photoluminescent material;
a first electrode provided on the color conversion layer;
a hole injection and transport layer provided on the first electrode;
a blue organic light-emitting layer provided on the hole injection and transport layer;
an electron injection and transport layer provided on the blue organic light-emitting layer; and
a second electrode provided on the electron injection and transport layer.

15. The display apparatus of claim 14, wherein the first phase modulation surface comprises a meta structure in which nano patterns are arranged periodically.

16. The display apparatus of claim 14, wherein the color conversion layer contacts an entirety of the first phase modulation surface of the first metal reflection layer.

17. The display apparatus of claim 14, wherein the at least one pixel further comprises a transparent planarization layer between the first metal reflection layer and the color conversion layer to cover the first phase modulation surface of the first metal reflection layer.

18. The display apparatus of claim 14, wherein the at least one pixel further comprises:
a second metal reflection layer provided on the second electrode and comprising a second phase modulation surface; and
a planarization layer provided between the second electrode and the second metal reflection layer to cover the second phase modulation surface of the second metal reflection layer.

19. The display apparatus of claim 14, wherein the plurality of pixels comprise a blue pixel, a green pixel, and a red pixel.

20. The display apparatus of claim 19, wherein the green pixel comprises a green photoluminescent material configured to convert blue light into green light, and
wherein the red pixel comprises a red photoluminescent material configured to convert blue light into red light.

* * * * *